United States Patent [19]

Takano et al.

[11] Patent Number: 4,807,239
[45] Date of Patent: Feb. 21, 1989

[54] DRIVE AND CONTROL CIRCUIT FOR LASER DIODE

[75] Inventors: Hiroshi Takano; Teiichi Shimane, both of Tokyo, Japan

[73] Assignees: Copal Electronics Co., Ltd.; Copal Co., Ltd., both of Tokyo, Japan

[21] Appl. No.: 32,814

[22] Filed: Apr. 1, 1987

[30] Foreign Application Priority Data

| Apr. 3, 1986 [JP] | Japan | 61-75473 |
| Apr. 3, 1986 [JP] | Japan | 61-75474 |
| May 12, 1986 [JP] | Japan | 61-106865 |
| Aug. 29, 1986 [JP] | Japan | 61-201629 |

[51] Int. Cl.$^4$ ............................... H01S 3/00
[52] U.S. Cl. ......................... 372/38; 372/25; 372/29; 372/30; 372/33; 455/613; 455/618
[58] Field of Search ............ 372/38, 25, 29, 30, 372/33; 455/613, 618

[56] References Cited

U.S. PATENT DOCUMENTS

| 4,237,427 | 12/1987 | Holland | 372/29 |
| 4,604,513 | 8/1986 | Lim | 372/38 |

FOREIGN PATENT DOCUMENTS

| 0162479 | 10/1982 | Japan | 372/38 |
| 0113546 | 6/1985 | Japan | 455/618 |
| 0170281 | 9/1985 | Japan | 372/38 |

Primary Examiner—William L. Sikes
Assistant Examiner—Georgia Y. Epps
Attorney, Agent, or Firm—Pollock, VandeSande & Priddy

[57] ABSTRACT

A drive and control circuit for laser diodes includes: a first switching element connected in series to a laser diode connected to a constant-current source for actuating the laser diode when a binary drive signal is at one level thereof; an impedance element connected in parallel to the series circuit of the laser diode and the first switching element, the impedance element being connected to receive the constant-current source together with the laser diode and having impedance characteristics substantially equal to those of the laser diode and the constant-current source; an integrator circuit for integrating the data at the one level; an impedance control circuit for variably controlling the impedance of the impedance element in response to the integrator circuit; and a second switching element connected in series to the impedance element for actuating the impedance element when the drive signal is at the other level. Furthermore, an alternative embodiment of the drive and control circuit includes the combination of a comparator, an integrator circuit, a constant-current circuit, a counter and a timer.

13 Claims, 9 Drawing Sheets

FIG. 4 (A)  FIG. 4 (B)
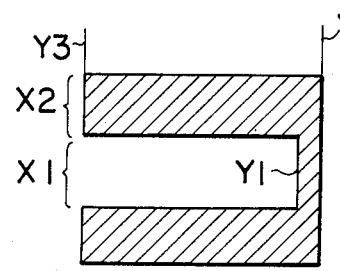
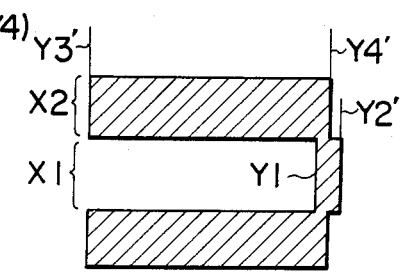
FIG. 5
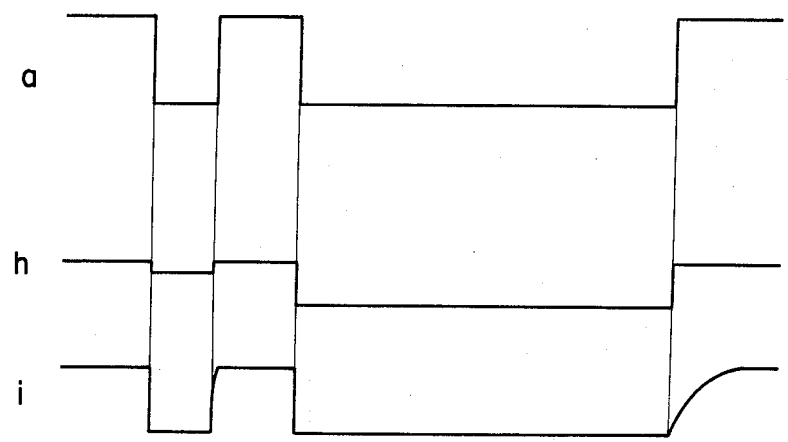

PRIOR ART

DRIVE AND CONTROL CIRCUIT FOR LASER DIODE

BACKGROUND OF THE INVENTION

1. Field of the Invention

The present invention relates to a drive and control circuit for high-speed switching of a laster diode in an optical printer and the like, and more particularly to a high-speed drive of a laser diode and stabilization of an optical output from the laser diode.

2. Description of the Prior Art

In what follows, the operation principles of a laser beam printer employed in general will be described with reference to FIG. 14.

Designated at 101 is a video signal generator for generating a video signal to be printed, 102 is a laser diode, 103 is a drive circuit, and 104 is a coupling lens for shaping a light beam emitted from the laser diode 102. Designated at 105 is a scanner motor, and 106 is a polygonal mirror, which is driven by the scanner motor. Likewise, designated at 107 is an f-0 lens, and 108 is a photosensitive drum, the surface of which is scanned with a laser beam transmitted via the polygonal mirror 106 and the f-0 lens 107. Any image so formed on the drum surface is available as a print through a xerography process (not shown).

A laser diode for use in such a laser printer is miniaturized and is capable of being rendered to direct modulation. It is, because of being semiconductor device, critically dependent on a temperature change. Namely, it provides an output remarkably varied depending on temperature. FIG.2 is a graph illustrating such a characteristic of a laser optical output with respect to temperature when driving the laser diode with a constant current, where the optical output is reduced as the temperature is raised.

There are two factors for such variations in the characteristics of a laser diode due to temperature; a long-term one based on a change in ambient temperature and on the temperature rise of the whole printer apparatus, and a short-term one based on the self-heating of the laser diode.

One of the variations in the characteristics of the laser diode caused by the self-heating is due to the rise of temperature of a casing enclosing the laser diode, which can be resolved by increasing the size of a radiating fin. Another one is due to the temperature rise caused by heat resistance between a drive junction and the casing, which is difficult to be solved from the structural view of the device.

Referring here to FIG. 3 which shows a timing chart for illustrating the dependency of a printed output from the laser printer upon temperature, chip temperature (b) of the laser diode, when the laser diode is powered at a level "H", follows an intermittent printing of data (a) and changes exponentially. In addition, an optical output (c) is distorted with respect to the printing data (a) owing to the starting characteristics of the laser and the temperature characteristics of the laser chip changing in response to temperature as shown in FIG. 2. Print-out data (d) is yielded by assuming a threshold Th of the optical output (c) to be a level indicated by a chain line in the same figure, in a xerography printing process. Such temperature characteristics will be examined together, hereinafter, with the starting characteristics of the laser diode.

The aforementioned print-out data (d) is shifted with respect to the printing data (a) particularly owing to the temperature characteristics of the optical output (c) at the initial power-on time of the laser diode .

FIG. 4 (A) shows an original picture image corresponding to the printing data (a) of FIG. 3, and FIG. 4 (B) shows that a picture image restored from the print-out data (d) of FIG. 3 is distorted. Namely, the situation in FIG. 4(B) is yielded as in FIG. 3 by scanning the figure from the left to the right, and when the laser diode is deenergized over positions Y1 and Y2 for a short period of time and thereafter energized as shown by the scanning over a region X1, the light-off time corresponds to a time interval t1–t2 of FIG. 3, and an off-position Y1'(corresponding to time t1) substantially accords with the position Y1 of the printing data but a successive on-position Y2'(corresponding to time t2) is delayed by a time fraction T1 from the position Y2 of the printing data. In addition, when the laser diode is deenergized over a long period of time corresponding to a time interval t3–t4 as in the scanning over a region X2 and then energized, the on-position Y4' is delayed by a time fraction T2 with respect to the position Y4 of the printing data. Hereupon, inequality T1>T2 holds because of the steep rise of the optical output (c) after the laser is deenergized over a long period of time, and these time durations T1 and T2 are minute so that the change of the printing in full size is negligible. However, the position Y2' is delayed by T1 $\propto$ T2 from the position Y4', and hence the printing is displaced to result in the deterioration of printing quality.

The frequency response of the laser diode including the starting characteristics thereof will be described herein.

In the optical printer, the maximum switching frequency f of the laser diode is expressed by $f = c \, LX \, LY \, D^2 P$ where LX is the lateral size of a printing paper, LY is the longitudinal size of the same, D is dot density (lines/mm), P is a printing speed (sheets/min), and C is a constant. However, with an optical printer requiring higher speed and density in recent years, a high-speed switching drive circuit of a laser diode is also needed . In addition, the waveform of a drive current of a laser diode is desired to be substantially the same as that of an input pulse as an image signal from a viewpoint of printing quality. Accordingly, the drive circuit, since the drive current waveform is a square wave, must have a frequency response sufficiently higher than the aforementioned maximum switching frequency f. Furthermore, the drive waveform is desired to be stable at a high speed since no overshooting and ringing are preferred from the viewpoint of printing quality upon the building-up and building-down of such a waveform.

FIGS. 15 and 16 show such prior switching circuits. The circuit shown in FIG. 15 is adapted to have a laser diode 1 connected to a constant-current source 3 via a transistor 2 and a series circuit of a transistor 4 and a resistor 5 connected in parallel to a series circuit of the laser diode 1 and the transistor 2, the transistor 4 being switched on upon receiving an L level signal of a video signal Vin on a base thereof while being switched off upon receiving an H level signal.

The transistor 2 is, while receiving a plus potential V2 on the base thereof, set to permit the laser diode 1 to be deenergized as the transistor 4 is switched on, and to provide impedance reduction thereof required for laser eneragization as the transistor 4 is switched off. The switching circuit shown in FIG. 16 in a simplified form of the circuit of FIG. 15 is adapted to permit the laser diode 1 to be energized by allowing the transistor 6 to be switched off upon the video signal Vin being the L level, while it is adapted to permit the laser diode 1 to be deenergized owing to a voltage drop thereacross by allowing the transistor 6 to be switched on upon the video signal Vin changing to the H level.

Although it should force the transistor 2 to alter voltage on the emitter thereof at a high speed, the circuit of FIG. 15 is limited in its operation by the frequency characteristics of the constant-current source 3. Likewise, the circuit of FIG. 16 suffers from the problem that the laser diode 1 depends, in its transition from its emitting to non-emitting state, on the impedance characteristic in itself, but the characteristic is unstable because the impedance of the laser diode 1 is sharply changed substantially from infinity to several tens of ohms around a threshold current thereof together with the impedance characteristic being altered owing to the capacitance thereof.

Let us here consider an optical output in a beam scanning device such as an optical printer and the like.

A control circuit for such an optical output is adapted, for example when scanning a drum surface of the printer with an optical beam through a rotating polygonal mirror, to set an optical output level of the laser diode in successive printing scanning in synchronization with a beam detection signal produced for each period not corresponding to a picture image, during which the polygonal mirror alters finishing, printing and scanning of one line and begins to repeat the same operation for the next line.

There are known some conventional methods to set such an optical output level. For example, one method is adapted to compare, in a period not corresponding to a picture image, an optical output level signal detected by an optical detector with a reference level in an analog manner, and sample-hold the result compared as such. Another method in a digital system is adapted to count pulses within a prescribed period or to stop the count operation in response to the positive or negative sign of such a compared signal, and to D-A convert the resulting counted valve.

However, with progress of such optical printers speeded up in their operation, control time for an optical output needs to be reduced more and more. Those devices as described above encounter thereupon the severe problems that they can not sufficiently deal with changes of the characteristics of a laser diode due to temperature rise thereof and the like since they are, particularly in an analog system, incapable of control for each line of printing because of their slow response to the comparison control and hence are obliged to effect the control for each page of printing. Those devices in a digital system furthermore suffer from problems other than the response speed described above. For example, variations of an optical output in a laser diode chip are insufficiently compensated and the number of bits of a D/A converter is increased, provided the amount of light to be controlled in one step of a counter is reduced for improving control accuracy.

SUMMARY OF THE INVENTION

In view of the drawbacks of those prior drive and control circuits for the laser diode described above, it is a first object of the present invention to improve the high frequency characteristic of a drive circuit of a laser diode.

A second object of the present invention is to prevent any printing displacement from being caused by a delayed high-speed switching response due to the temperature characteristics of a laser diode.

A third object of the present invention is to provide a control circuit capable of solving the aforementioned problems concerning the response speed and control accuracy of the drive and control circuit for an optical output, and capable of stabilizing at a high-speed the optical output upon the starting of the control.

To achieve the above objects, the first invention is adapted to include a first switching element connected in series to a laser diode connected to a constant-current source for actuating the laser diode when a binary drive signal is at one level; an impedance element connected in parallel to said series circuit of the laser diode and the first switching element, said impedance element being connected to receive the constant, current source together with the laser diode and having an impedance characteristic substantially equal to that of the laser diode; and a second switching element connected in series to said impedance element for actuating said impedance element when said drive signal is at the other level.

According to the first invention, the laser diode and the impedance element provide equivalent electrical loads, and these loads are alternately switched response to the binary drive signal and connected to the constant-current source. Accordingly, there is reduced a transient impedance change upon the switching, whereby a current to the laser diode is high-speed switched and stably supplied thereto without causing any change in a potential on the load side of the constant-current source.

In addition, to achieve the above object, the second invention is adapted to include a first switching element connected in series to a laser diode connected to a constantcurrent source for actuating the laser diode when a binary drive signal is at one level; an impedance element connected in parallel to the series circuit of the laser diode and said first switching element and further connected to the constant-current source in common with the laser diode; an integrator circuit for integrating the data being at said one level; an impedance control circuit for variably controlling the impedance of said impedance element response to said integrator circuit; and a second switching element connected in series to said impedance element for acutating said impedance element when said drive signal is at the other level.

According to the second invention, the laser diode and the impedance element are connected in parallel to the constant-current source to permit a current to be alternately conducted through these elements, and the impedance of the impedance element is adjusted of the basis of an integrated result of data associated with the driving of the laser diode. Accordingly, with the impedance of the impedance element adjusted as such, the impedance of the impedance element is made substantially equivalent to the impedance of the laser diode, and the laser diode is immune to temperature rise in response to the integrated result, i.e., continuation time of light-off of the laser diode. Thus, the impedance of the impedance element is reduced to bring the voltage across the laser diode to a lower value when it is deenergized , whereby any influence of the continuation time on the starting of the laser diode as it is energized can be eliminated to prevent the printing displacement of the type described above from being produced.

To furthermore achieve the above object, the third invention is adapted to include a comparator for comparing an optical output level signal by detecting an available optical output of a laser diode which is energized by receiving a video signal with a prescribed reference level value and delivering a signal indicative of a relative difference between the optical signal and the reference level (i.e., indicating a state whether the optical output level signal is above (+) the reference level or below (−) the same) (this signal is hereinafter referred to simply as a relative difference signal ); an integrator circuit for integrating the relative difference signal; a constant-current circuit for setting the current flowing through the laser diode by increasing or decreasing the same in response to an integrated value from said integrator circuit; a counter for counting the number of times of reversal of positive and negative signs of the relative difference signal with the lapse of time over a prescribed period of time; and a timer for causing said constant-current circuit to drive the laser diode over a prescribed period of time in any pause intervals of a video signal, for enabling the integration function of said integrator circuit, and for disabling the same based on a fact of said counter finishing the counting of a said prescribed number at the end of said prescribed period or before this end.

According to the third invention, the optical output level signal is delayed in its phase from the optical output signal of the laser diode for permitting the optical output level signal entered into the comparator to slightly go over the reference level and go back below the reference level and thereafter repeat this operation without staying stably on the reference level in the pause intervals of the video signal. And, the counter is thereupon adapted to count the number of times of the optical output level signal going over and back below the reference level, and to hold, on the basis of a fact of this number of times reaching a prescribed one, a current set value of the constant-current circuit thereon over the next printing period. Thus, the optical output of the laser diode is settled to a value set in prescribed duty time after its stabilization.

The above and other objects, features and advantages of the present invention will become more apparent from the following description when taken in conjunction with the accompanying drawings in which preferred embodiments of the present invention are shown by way of illustrative example.

BRIEF DESCRIPTION OF THE DRAWINGS

FIGS. 4 (A) and (B) are views respectively illustrating a printed result being displaced owing to the characteristic of FIG. 3;

FIG. 5 is a timing chart illustrating a desired operation characteristic of the present invention in relation to Figs.1 and 3;

FIG. 10 is a view illustrating an operation characteristic of the integrator circuit upon a power source being thrown in;

FIG. 13 is an operation characteristic of the integrator circuit upon a power source being thrown in;

DESCRIPTION OF THE PREFERRED EMBODIMENT

In what follows, embodiments of the first, second and third inventions will be described with reference to the accompanying drawings.

Figure 1:
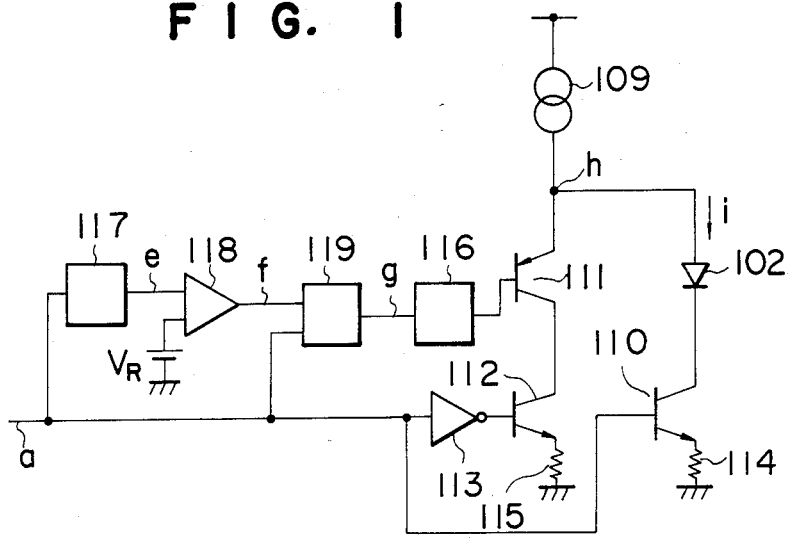
FIG. 1 is a drive circuit for a laser diode illustrating an embodiment of the second invention.
Figure 2:
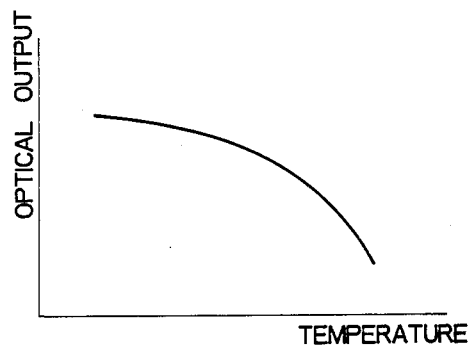
FIG. 2 is a view showing a temperature characteristic of an optical output of a laser diode.
Figure 7:
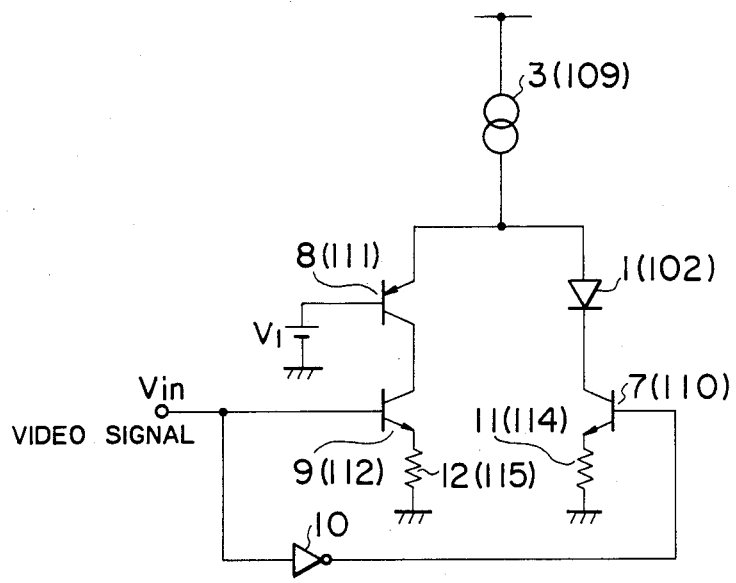
FIG. 7 is a block diagram of a drive circuit illustrating an embodiment of the first invention.

FIGS. 1 and 7 are respective circuit diagrams of drive circuits for a laser diode illustrating the embodiments of the first and second inventions. The same symbols shall be applied to the same constituent portions as those in the prior examples described heretofore. Moreover, portions where descriptions of the embodiments of the first and second inventions overlap will be substituted by the description of the first invention, (for the second embodiment symbols within parentheses just behind those of the first one may be read.)

Referring here to FIG. 7, designated at 1(102) is a laser diode, 3(109) is a constant-current source, 7(110) is a transistor being a first switching element, 8(111) is a transistor being an impedance element, and 9(112) is a transistor being a second switching element. The laser diode 1 is connected to the constant-current source, and the transistor 7 is connected in series to the laser diode 1. The transistor 7 further receives a videosignal Vin (printing data (a)) on its base via an inverter 10 (not provided in the second invention), and is switched on when the video signal Vin (printing data (a) is at an L level (H level) to force the laser diode 1(102) to be energized, while the transistor 7 is switched off when the video signal Vin is at an H level (L level) to force the laser diode 1(102) to be deenergized. The transistor 8(111) is disposed in parallel to the laser diode 1(102) to receive the constant-current source 3(109) in common with the laser diode 1, and set by constant voltage V1 to have a substantially equivalent impedance characteristic to that of the laser diode 1(102). (In the second invention, there is no constant voltage V1, and the impedance characteristic of the transistor 8 is set and controlled to be substantially equivalent to that of the laser diode 102 as described later.) Thereupon, a voltage drop of the transistor 8(111) during operation thereof is set to about 1.8 V, for example, being substantially the same as that of the laser diode 1(102) during operation thereof. The transistor 9(112) paired with the transistor 7(110) and selected to have the same characteristic as that of the latter partner 7(110) is connected in series to the transistor 8(111). The transistor 9(112) further receives directly on its base the video signal Vin (printing data (a)) and is switched on when the video signal Vin (printing data (a)) is at the H level to energize thereupon the transistor 8(111) as a load of the constant-current source 3(109) while it is switched off when the video signal Vin (printing data (a)) is at the L level (H level) to deenergize thereupon the transistor 8(111). Hereupon the resistors 11,12(114,115) serve to set the respective transistors 7, 9(110,112) to their active states for speeding up their responses to the video signal Vin (printing data (a)).

With the arrangement described above, in the embodiment of the first invention, when the square wave video signal Vin is at the H level, the transistor 7 is switched off and the transistor 9 is switched on, and hence a constant current is conducted through the transistor 8 by the constant-current source 3. When the video signal Vin changes to the L level, the transistor 7 is switched on and the transistor 9 is switched off to shut off the current flowing through the transistor(8) for simultaneously permitting a constant current to flow through the laser diode 1. Thus, the transistor 8 and the laser diode d1 as loads are switched so as to be alternately operated without causing any voltage change on the load side of the constant-current source 3.

Moreover, in the circuit of FIG. 7, the impedance element may be arranged by connecting a plurality of diodes in series instead of the transistor 8.

In the second embodiment, the following description is added to the above arrangement.

Namely, in FIG. 1, designated at 116 is a bias circuit as an impedance control part. The impedance of the transistor 111 is controlled by the above bias circuit 116 to be the same as that of the laser diode 102, a potential at a point (h) is prevented from changing upon the alternate operation of the transistors 110 and 112 following up the printing data, whereby the current alternately flowing through the transistors 110 and 112 is kept substantially unchanged in high-speed switching.

Figure 3:
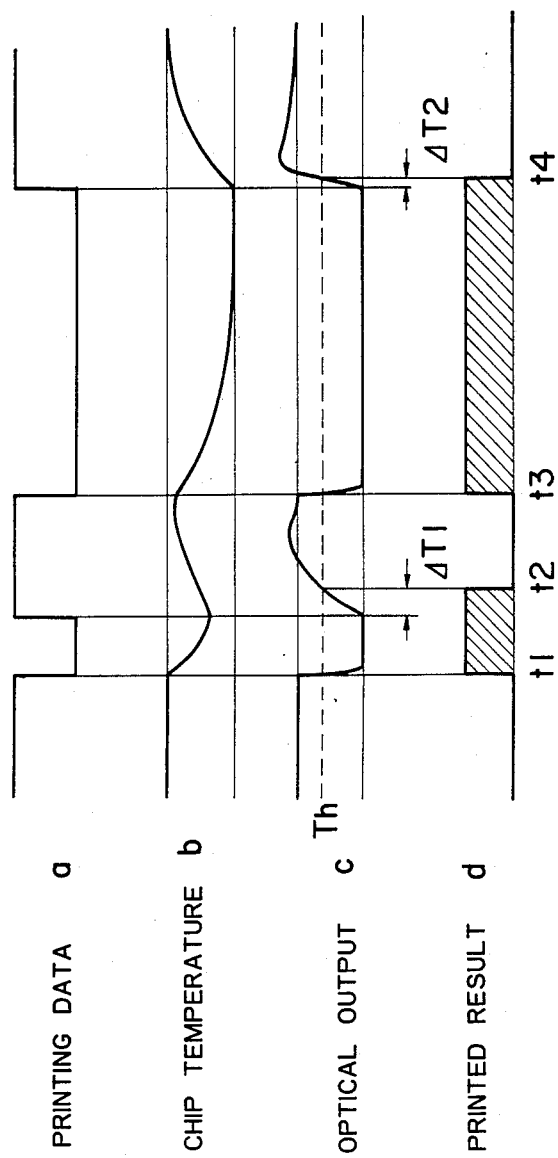
FIG. 3 is a timing chart illustrating temperature dependence of a printed output in a laser beam printer.

However, when the light-off time of the laser diode is longer in FIG. 3 as described previously, the optical output when the laser is energized in turn is quickly built up. Accordingly, when the light-off time is shorter, the building-up of the current i flowing through the laser diode 102 is made steeper by decreasing the impedance reduction of the transistor 111 during the light-off of the laser, i.e., during the operation of the transistor 111 and thereby relatively raising the potential at the point h as shown in FIG. 5, while when the light-off time of the laser is longer, the building-up of the current i is made more gentle by increasing the impedance reduction and lowering the potential at the point h, whereby the building-up of both the optical outputs is preferably made comparable.

Designated at 117 is an integrator circuit, which receives the printing data (a) and delivers an integrated result (e) concerning a characteristic corresponding to the chip temperature (b). Designated at 118 is a comparator, which compares the above integrated value (e) with a prescribed reference potential VR, whereby it delivers an output (f) of the H level when the former is more than the latter and an output (f) of the L level when the former is less than the latter. Likewise, designated at 119 is an OR circuit, which receives the above output (f) from the comparator 118 and the printing data(a) to provide a logical sum(g). The bias circuit 116 is controlled by a binary value based on the output (g).

Namely, when the output (g) is at the H level, the laser is frequently energized to emit light and hence the transistor 111 becomes high impedance in either case of operation and non-operation of the transistor 112 to make the point (H) a high potential for making the current i steep. While, when the output (g) is at the L level, the transistor 111 becomes low impedance when the transistor 112 is operated since the above output (g) being at the L level is caused as a result of the light-off time being longer, whereby the point (h) is made a low potential to make the building-up of the current i more gentle. In such a manner, the building-up characteristics of the optical output (c in FIG. 3) is corrected by that of the current i (refer to i in FIG. 5) and thus the printing displacement due to a temperature change in the laser diode 102 over a short period of time is corrected.

Figure 6:
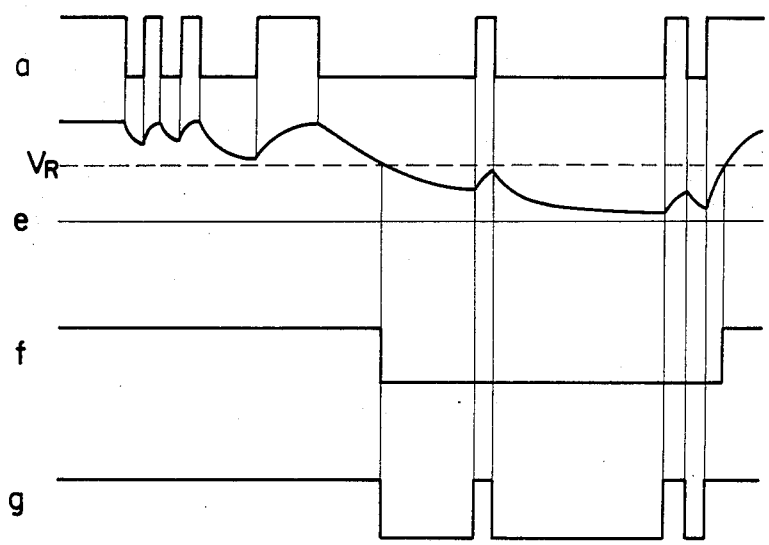
FIG. 6 is a timing chart exemplarily showing the operation of FIG. 1.

Hereupon, in FIG. 6, the reference potential VR is assumed to be constant with the amount (g) of control for the bias circuit 116 being assumed to be binary. This is satisfactory in general, but it is also possible, when finer resolution is required, to provide a plurality of the comparators 118 and set a plurality of potentials VR for thereby controlling the bias circuit 116 in multiple levels.

Furthermore, provided the integrated value (e) is level-converted with the use of an amplifier instead of the comparator 118 in FIG. 1 and for example make its maximum value so level-converted it is made coincident with the H level of the printing data (a), and further provided both that values are summed up using an adder circuit instead of the OR circuit 119, the bias circuit 116 is controlled as the respective minimum values are reflected on the curve (e) of FIG. 6, even in starting the laser diode with high accuracy.

In succession, a first embodiment of the optical output control circuit according to the third invention will be described with reference to FIGS. 8, 9,and 10.

Figure 8:
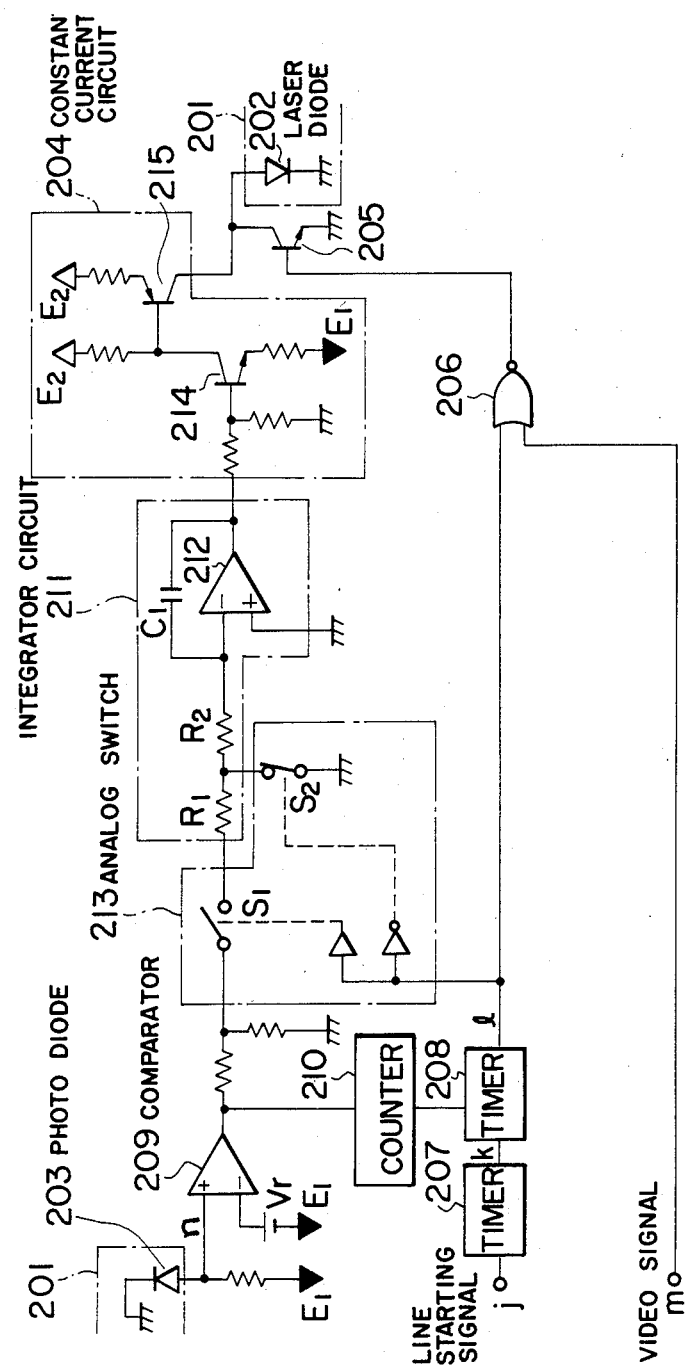
FIG. 8 is a block diagram of an optical output control circuit illustrating a first embodiment of the third invention.
Figure 9:
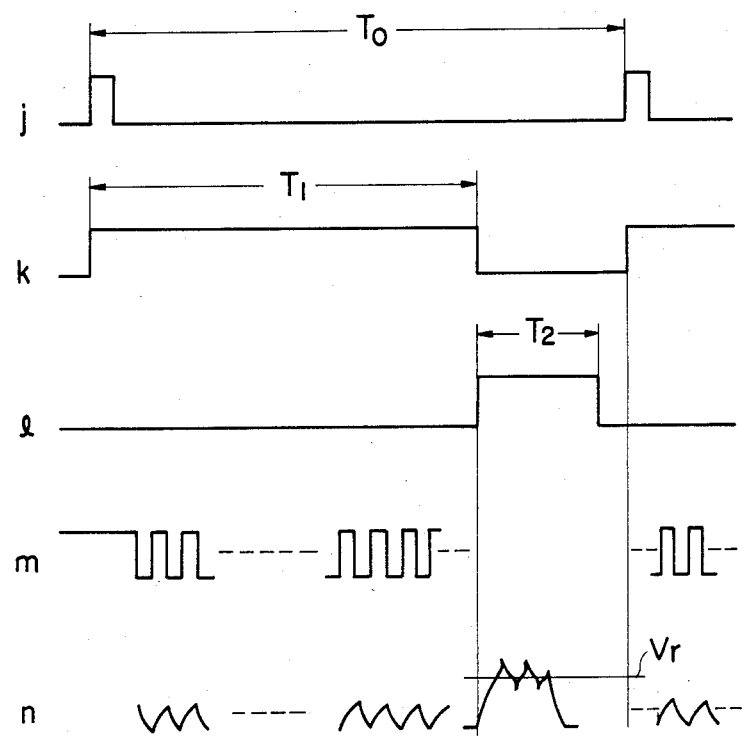
FIG. 9 is a timing chart illustrating operations of respective portions of FIG. 8.

FIG. 8 is a circuit block diagram of the optical output control circuit illustrating the first embodiment of the third invention, and FIG. 9 is a timing chart illustrating respective operations of respective portions of the optical output control circuit.

Designated at 201 is a laser diode assembly wherein a laser diode 202 and a photodiode are housed in the same package. A constant-current circuit 204 makes constant a current flowing through the laser diode 202. A transistor 205 controls light-on and off of the laser diode 202 in response to a light emission control signal provided via a NOR gate 206. A signal (j) is a line starting pulse signal which sets a period T0 of printing over one line. Designated at 207 is a timer for setting a printing interval, an output signal (k) which sets a printing interval T1 with use of a signal (j) pulse as a starting point. Designated at 208 is a timer for setting a sampling interval, an output signal (1) which sets the maximum value T2 of an integration interval described later in a printing pause interval with use of the end point of the printing interval T1 as a starting point. A signal (m) is a video signal, whose high (H) level corresponds to white and low (L) level to black in FIG. 9. The aforementioned signal(1) is at the L level in the printing interval T1, and thereupon enables the video signal (m) for the transistor 205. The signal (1) is at the H level in the interval T2, and forces independently of the video signal (m) the transistor 205 to control the laser diode 202 for its light emission. A signal (n) is an optical output level signal, i.e., an electric signal yielded by detecting the optical output of the laser diode 202 with use of the photodiode 203, whose level is changed in proportion to the optical output of the laser diode 202 with some delay. The photodiode 203 is thereupon back-biased by negative electrode E1. Designated at 209 is a comparator, which takes a positive potential Vr with respect to a power source E1 as a reference level value and issues an H level signal when the optical output level signal (n) goes over the potential Vr. Likewise, designated at 210 is a counter, which counts a building-up signal by which the comparator 209 changes to the H level, and alters the output signal (1) of the timer 208 to the L level upon reading the prescribed count number provided the control lies within the interval T2. Designated at 211 is an integrator circuit, which consists of, as an operational amplifier, resistors R1 and R2 and a capacitor C1, etc., and integrates, upon receiving the output signal from the comparator 209, the output signal in repsonse to a positive or negative level of the output signal. Designated at 213 is an analog switch, which has its contact S1 being opened and its contact S2 being closed when the output signal (1) of the timer 208 is at the L level to hold the output of the integrator circuit 211 and which has, on the other hand, its contact S1 being closed and its contact S2 being opened when the output signal level (1) is at the H level to permit the integrator circuit (1) to receive the output signal from the comparator 209 for integration thereof. The constant-current circuit 204 receives the output from the integrator circuit 211 on the basis of a first stage transistor 214 with high impedance, and keeps substantially constant the above output signal over the printing interval of one line. The transistor 214 receives on respective terminals thereof a positive voltage V2 and a negative voltage E1 to be thereby set to a constant current in response to the output from the integrator circuit 211. A second stage transistor 215 receives the current flowing through the transistor 214 for thereby setting the laser diode 202 connected to the transistor 214 as a load to the constant current in response to the output signal from the integrator circuit 211.

In the following, operation of the optical output control circuit of the third invention arranged as described above will be explained.

In the printing interval T1, the output signal (1) of the timer 208 is at the L level with that analog switch 213 being opened in its contact S1 and closed in its contact S2 as shown in FIG. 8, and with the integrator 211 being kept on its pre-state. The NOR gate 206 enables the video signal (m), by which signal the laser diode 202 is controlled in its light emission. The photodiode 203 detects the output of the laser diode 202. Thereupon, although the optical output level signal (n) is changed, it is not employed since the contact S1 is opened at that time.

When printing over one line is finished to permit the signal (1) to become the H level, the contact S1 is closed and the contact S2 is opened, whereby the integrator circuit 211 starts to integrate the output signal from the comparator 209. Simultaneously, the laser diode 202 is driven in succession by the set current from the constant-current circuit 204 independently of the video signal (m). The photodiode 203 detects an optical output from the laser diode 202, and the optical output level signal (n) is for example raised. When the optical output level signal (n) is lower than the reference level Vr, the integrator 211 permits its integrated value to be increased thereby allowing the optical output from the laser diode 202 to be increased. When the optical output level (n) becomes to the H level, the counter 210 is permitted to count the building-up of the output of the comparator 209. The integrator circuit 211 reduces its integration value to permit the laser diode 202 to lower its output. Thus, the optical output level signal (n) begins to be reduced. With repetition of this operation, the optical output of the laser diode 202 reaches its stable state because of the temperature of the laser diode 202 becoming constant followed by small variations of the optical output level signal (n) around the reference level Vr. When the counter 210 reaches a prescribed count number, the output signal of the timer 208 changes to the 1 level with the contact S1 being opened and the contact S2 being closed, whereby the integrator circuit 211 holds its integration value at that time to permit the current flowing through the laser diode 202 in a successive printing interval T1 to be set.

Figure 10:
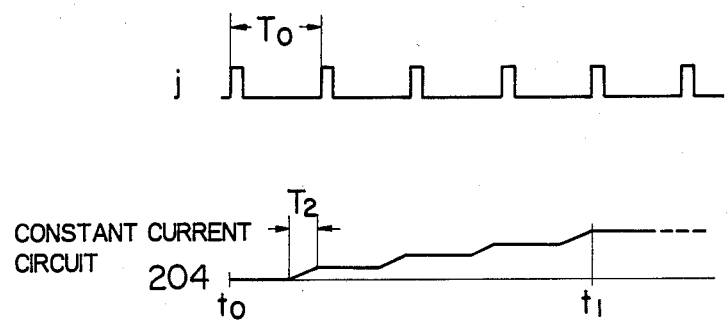

FIG. 10 illustrates a change of the state of the constant-current circuit 204 dependent upon the integration value of the integrator circuit 211 at the initial time of the control power source being thrown in while corresponding it to the repetition period T0 of printing. Building-up of rotation of the rotary pclygonal mirror upon throwing the power source in requires a certain time, and hence the counter 210 counts nothing in an interval from the time of the throwing-in of the power source to the time t1 when the above building-up is substantially finished, and the integrator circuit 211 is rendered to its integration operation over the full interval T2 set by the timer 208. And when ordinary operation is reached, the counter 210 sets a time reduced in the interval T2. The time constant of the integrator circuit determined by the resistors R1 and R2, and the capacitor C1, etc., is to deal with minute changes in the signal (n) in the vicinity of the reference level Vr, and can be made relatively small to improve the accuracy of the optical output.

Figure 11:
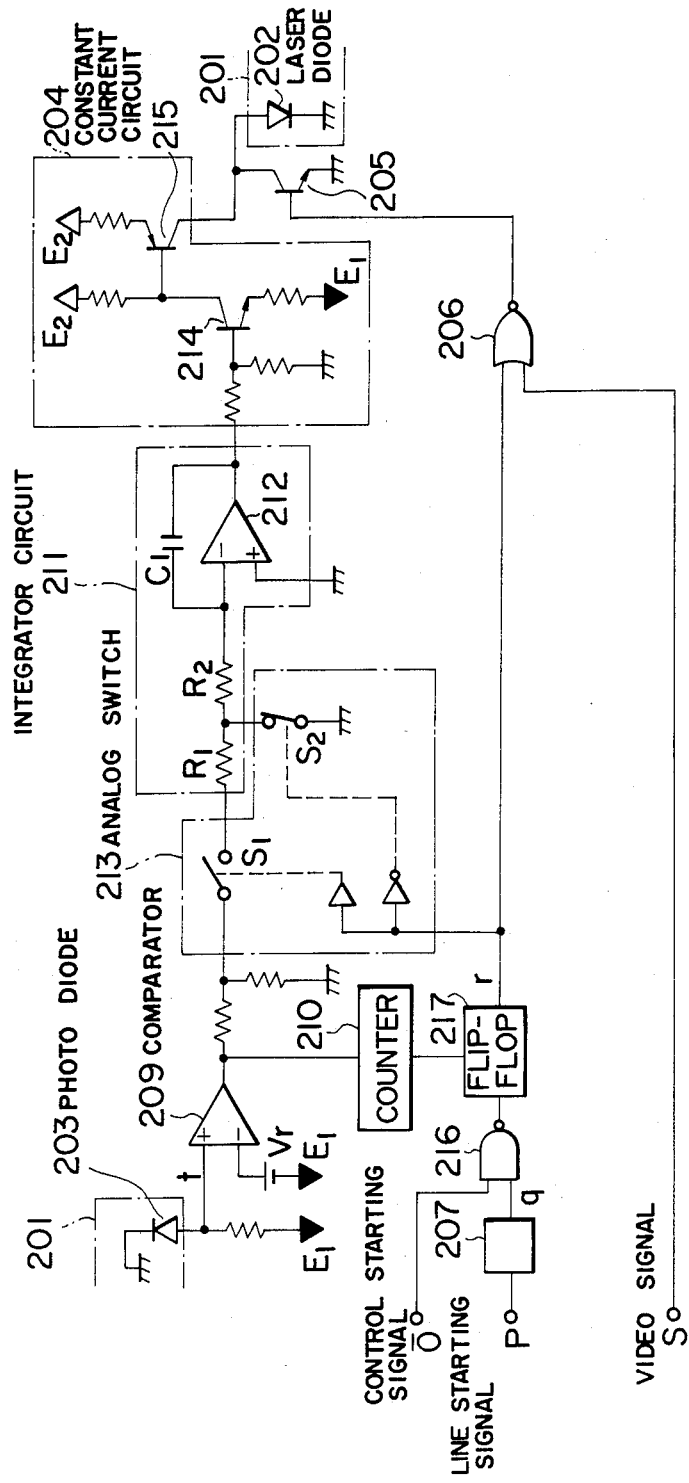
FIG. 11 is a block diagram of an optical output control circuit illustrating a second embodiment of the third invention.
Figure 12:
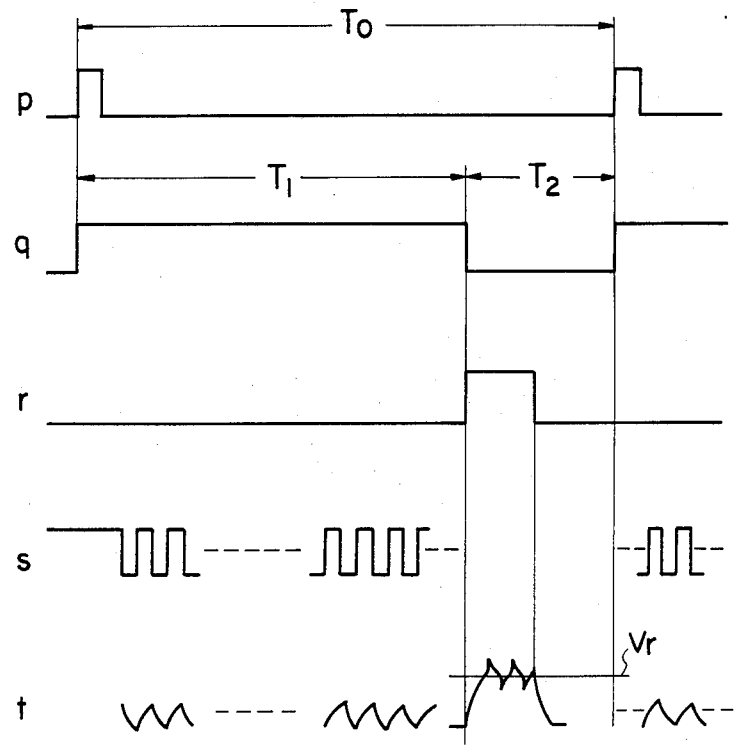
FIG. 12 is a timing chart illustrating operations of respective portions of FIG. 11.
Figure 13:
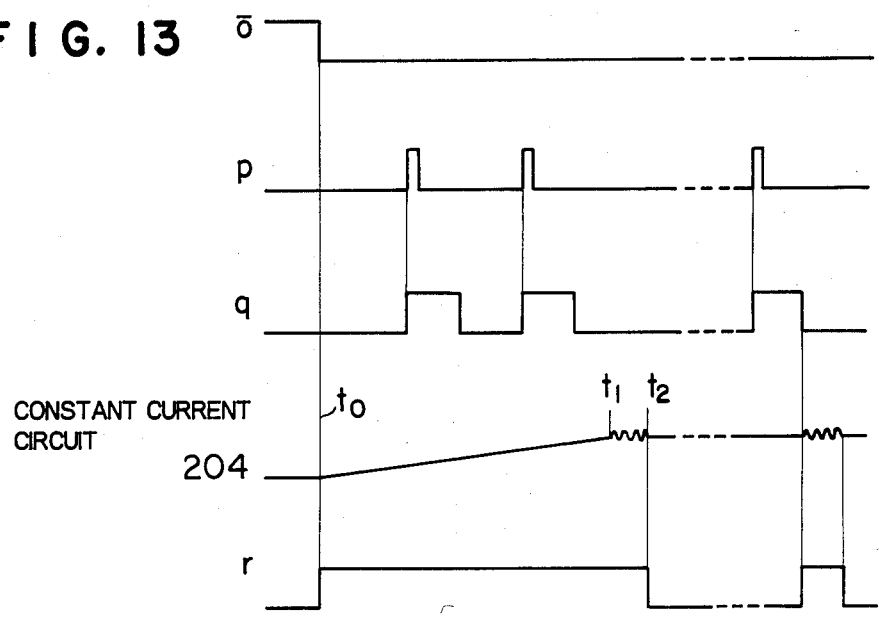
Figure 14:
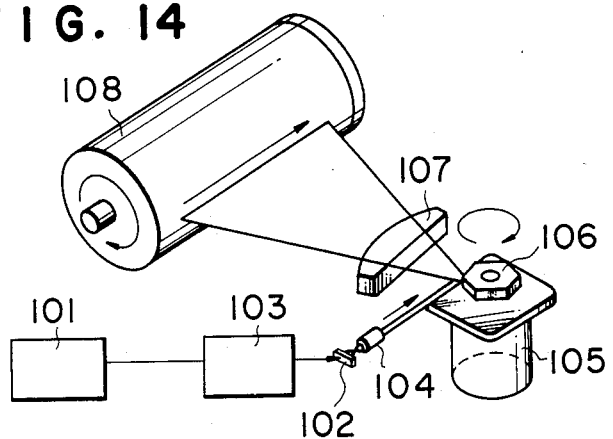
FIG. 14 is a view illustrating operation principles of the laser printer.
Figure 15:
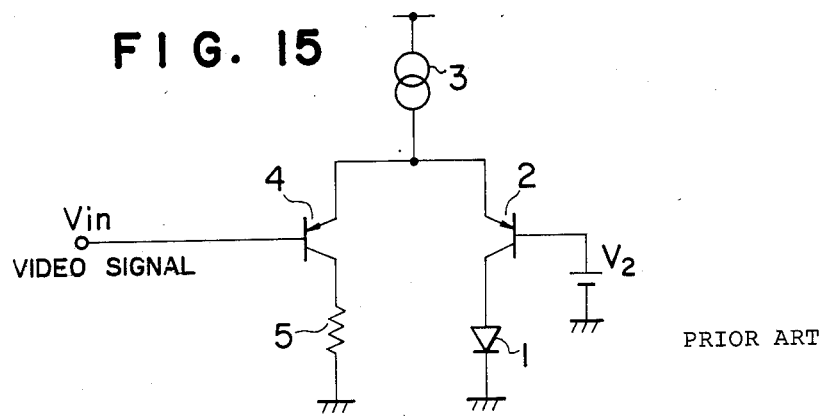
FIG. 15 is a block diagram illustrating a prior drive circuit.
Figure 16:
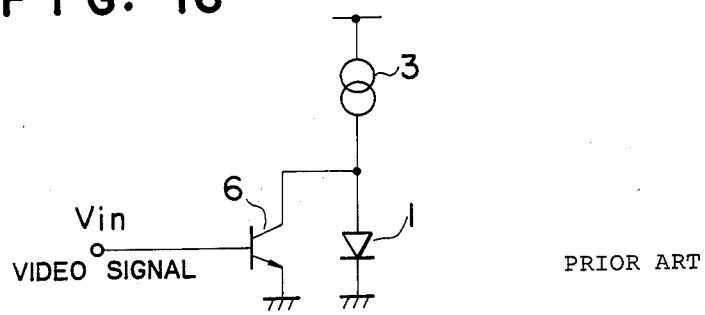
FIG. 16 is a view exemplarily illustrating a prior drive circuit in a simplified form.

In addition, a second embodiment of the optical output control circuit according to the third invention will be described with reference to FIGS. 11, 12 and 13. This embodiment is substantially the same as that of the first one excepting that a NAND gate 216 (when the line starting signal P is assumed negative) and a flip-flop 217 for setting the sampling interval are added and substituted (the flip-flop 217 is added instead of the timer 208 of FIG. 8) between the timer 207 and the counter 210 of FIG. 8 for improving timing relation at the initial time of the control. Thereupon, when the line starting signal P is positive, an OR gate is employed instead of the NAND gate.

Accordingly, basic operation of the second embodiment is the same as that in the first embodiment described heretofore, and the improvement thereof as compared with the first one is in timing operation described below.

Namely, the flip-flop 217 is set, whereby the laser diode 202 is driven in succession by the set current of the constant-current circuit 204 dependent upon the integrated value by the integrator circuit 211 independently of the video signal S. When the integrated value reaches a steady one at time t1, the signal (t) reaches the potential Vr as in FIG. 12 for thereby permitting the counter 210 to start its counting operation. When a prescribed count value is attained at the time t2, the flip-flop 217 is set, and there of the aforementioned stationary control is conducted.

As described heretofore, according to the first invention, the constant-current source supplies a current to the equal load both upon conduction and non-conduction of the laser diode to result in no change in the potential on the load side of the constant-current source for thereby enabling the laser diode to be rendered to high-speed switching and hence to cope with various optical printers being made high speed and high density. The circuit therefore is realized with a simple arrangement having circuit elements added to the prior ones.

In addition, according to the second invention, the laser diode and the impedance element are connected to the constant-current source, and the impedance of the impedance element is adjusted and controlled on the basis of the integration of data associated with the driving of the laser diode. Accordingly, with the data set in relation to the temperature characteristic of the chip of laser diode, it is made possible to render a building-up characteristic of the optical output due to the interval of the light-off time of temperature compensation. Thus, there is produced no shift of printing associated with the number of times of the light-on of the laser diode in printing for thereby improving printing quality.

Furthermore, according to the third invention, the comparator is adapted to detect repetitive minute changes in the value of the constant current set by means of the integrator circuit to check by a prescribed count number that the change reaches a prescribed level. Accordingly, high-speed control is assured with the simple arrangement, and any error produced by noises upon the detection can also be corrected. Moreover, any variation in the optical output from the laser diode and any changes in the characteristics thereof due to temperature are reflected on the counting rate of the counter for assuring uniform optical control. In addition, at the starting of the control the laser diode and the integrator circuit are countinuously operated until the optical output level of the laser diode reaches the reference level to permit the optical output to be rapidly built up and to be stabilized.

Furthermore, the present apparatus is adjustable independently as an optical scanning unit to ease maintenance.

Although certain preferred embodiments have been shown and described, it should be understood that many changes and modifications may be made therein without departing from the scope of the appended claims.

What is claimed is:

1. A drive and control circuit for laser diodes comprising:
    (a) first switching means connected in series to a laser diode for actuating the laser diode when a binary drive signal is at one of its levels, said laser diode being connected to a constant-current source;
    (b) impedance means connected in parallel to said series circuit of the laser diode and the first switching means, said impedance means being connected to the constant-current source together with the laser diode, said impedance means having impedance characteristics substantially equal to those of the laser diode; and
    (c) second switching means connected in series to said impedance means for actuating said impedance means when said drive signal is at the other of its levels.

2. A drive and control circuit for laser diodes according to claim 1 wherein said first switching means, impedance means, and second switching means are respectively transistor.

3. A drive and control circuit for laser diodes according to claim 1 wherein said first and second switching means are paired and have the same characteristics.

4. A drive and control circuit for laser diodes according to claim 1 wherein said impedance means is a plurality of series-connected diodes.

5. A drive and control circuit for laser diodes comprising:
    (a) first switching means connected in series to a laser diode for actuating the laser diode when a binary drive signal is at one of its levels, said laser diode being connected to a constant current source;
    (b) impedance means connected in parallel to the series circuit of the laser diode and said first switching means and further connected to the constant-current source in common with the laser diode;
    (c) an integrator circuit for integrating data fed thereto, the data being representative of the binary drive signal, said integrator circuit integrating the data at said one level of the binary drive signal;
    (d) an impedance controlling part for controlling the impedance of said impedance means in response to said data integrated by said integrator circuit; and
    (e) second switching means connected in series to said impedance means for actuating said impedance means when said drive signal is at the other of its levels.

6. A drive and control circuit for laser diodes according to claim 5 wherein said first switching means, impedance means, and second switching means are respectively transistors.

7. A drive and control circuit for laser diodes according to claim 5 wherein said first switching means and said second switching means are paired and have the same characteristics.

8. A drive and control circuit for laser diodes according to claim 5 wherein said impedance controlling part is a bias circuit.

9. A drive and control circuit for laser diodes according to claim 5 wherein said drive and control circuit further includes a comparator interposed between said integrator circuit and said impedance controlling part.

10. A drive and control circuit for laser diodes according to claim 9 wherein a plurality of said comparators are provided.

11. A drive and control circuit for laser diodes comprising:
    (a) a comparator for comparing an available optical output level signal corresponding to an optical output from a laser diode which is energized upon receipt of a video signal with a prescribed reference level value, and outputting a signal indicative of a relative difference between the optical signal and the reference level;
    (b) an integrator circuit for integrating the relative difference signal;
    (c) a constant-current circuit for controlling the current flowing through the laser diode by increasing or decreasing the same in response to an integrated value outputted from said integrator circuit;
    (d) a counter connected to the output of the comparator for counting the number of times the relative difference signal has a reversal of positive and negative signs with the lapse of time over a prescribed period of time; and (e) a timer working cooperatively with said counter for causing said constant-current circuit to drive the laser diode over a predetermined period of time in any of the pause intervals of the video signal, for enabling said integrator circuit, and for disabling the same when said counter finishes counting a prescribed number of sign reversals, either at, or before, the end of said predetermined period of time.

12. A drive and control circuit for laser diodes according to claim 11 wherein said integrator circuit comprises an operational amplifier, resistors, and capacitors.

13. A drive and control circuit for laser diodes according to claim 11 wherein said timer is a flip-flop, and wherein the drive and control circuit further comprises a timing control terminal for permitting a NAND gate or an OR gate to be interposed between said flip-flop and a signal input terminal.

* * * * *

UNITED STATES PATENT AND TRADEMARK OFFICE
CERTIFICATE OF CORRECTION

PATENT NO. : 4,807,239
DATED : February 21, 1989
INVENTOR(S) : Hiroshi Takano, et al.

It is certified that error appears in the above-identified patent and that said Letters Patent is hereby corrected as shown below:

```
Column 1, line 8, change "laster" to --laser--.
Column 1, line 50, change "drive junction" to --device
                    junction--.
Column 2, line 29, change "T1& T2 to --T1 - T2--.
Column 2, line 68, change "eneragization" to --energization--
Column 4, line 29, after "switched" insert --in--.
Column 4, line 48, after "element" insert --in--.
Column 4, line 50, change "acutating" to --actuating--.
Column 4, line 56, change "of" (second occurrence) to
                    --on--.
Column 5, line 5, before "optical" insert --available--.
Column 5, line 6, delete "available".
Column 5, line 64, change "Figs.1" to --FIGS. 1--.
Column 6, line 46, change "videosignal" to --video signal--.
Column 8, line 12, change "characteristics" to
                    --characteristic--.
Column 8, line 30, change "both that" to --that both--.
Column 9, line 3, after "by" insert --a--.
Column 10, line 1, delete "to".
Column 10, line 67, delete "of".
Column 11, line 9, change "realized" to --realizable--.
```

UNITED STATES PATENT AND TRADEMARK OFFICE
CERTIFICATE OF CORRECTION

PATENT NO. : 4,807,239

DATED : February 21, 1989

INVENTOR(S) : Hiroshi Takano, et al.

It is certified that error appears in the above-identified patent and that said Letters Patent is hereby corrected as shown below:

Column 11, line 20, change "of" to --to--.
Column 11, line 37, change "countinuously" to --continuously--.
Column 12, line 2, change "transistor" to --transistors--.

Signed and Sealed this

Nineteenth Day of September, 1989

Attest:

DONALD J. QUIGG

Attesting Officer

Commissioner of Patents and Trademarks